United States Patent
Fernandez et al.

(10) Patent No.: US 8,054,139 B2
(45) Date of Patent: Nov. 8, 2011

(54) VOLTAGE-CONTROLLED OSCILLATOR TOPOLOGY

(75) Inventors: Francisco Fernandez, San Jose, CA (US); Alexei Shkidt, Newark, CA (US)

(73) Assignee: Silicon Labs Spectra, Inc., Sunnyvale, CA (US)

( * ) Notice: Subject to any disclaimer, the term of this patent is extended or adjusted under 35 U.S.C. 154(b) by 0 days.

(21) Appl. No.: 12/388,086

(22) Filed: Feb. 18, 2009

(65) Prior Publication Data

US 2009/0206936 A1    Aug. 20, 2009

Related U.S. Application Data

(60) Provisional application No. 61/029,653, filed on Feb. 19, 2008.

(51) Int. Cl.
*H03K 3/03* (2006.01)

(52) U.S. Cl. .......................................... 331/57; 331/185

(58) Field of Classification Search .................... 331/45, 331/57, 185, 186
See application file for complete search history.

(56) References Cited

U.S. PATENT DOCUMENTS

| | | | |
|---|---|---|---|
| 6,710,667 B2 * | 3/2004 | Nagano | 331/57 |
| 6,803,831 B2 * | 10/2004 | Nishikido | 331/57 |
| 6,911,857 B1 * | 6/2005 | Stiff | 327/281 |
| 7,138,879 B2 * | 11/2006 | Su | 331/74 |
| 7,176,737 B2 * | 2/2007 | Baker et al. | 327/280 |
| 7,592,877 B2 * | 9/2009 | Shiramizu et al. | 331/57 |
| 2008/0088379 A1 * | 4/2008 | Chen | 331/57 |
| 2009/0206875 A1 | 8/2009 | Tran et al. | |

* cited by examiner

*Primary Examiner* — Levi Gannon
(74) *Attorney, Agent, or Firm* — Zagorin O'Brien Graham LLP (57) ABSTRACT

A voltage-controlled oscillator is implemented with a succession of delay cells coupled in series to form an oscillator loop. The oscillator loop is supplied with reference voltages produced by a voltage generator. The reference voltages produce stable operation of the voltage-controlled oscillator. Cascode reference current generators are incorporated within the voltage generator to supply a cross-coupled arrangement of pull-up devices within each delay cell. The cross-coupled pull-up devices are instrumental in producing complementary output signaling from each delay cell. A pair of cascode current generators is configured in parallel to produce a magnitude of current according to an applied voltage and to be selectable for dual or single operation with a corresponding frequency determination.

30 Claims, 8 Drawing Sheets

VOLTAGE-CONTROLLED OSCILLATOR TOPOLOGY

CROSS-REFERENCES TO RELATED APPLICATIONS

This application claims priority from U.S. Provisional Patent Application No. 61/029,653, filed Feb. 19, 2008, entitled "VOLTAGE-CONTROLLED OSCILLATOR TOPOLOGY," which is hereby incorporated by reference, as if set forth in full in this document, for all purposes.

BACKGROUND

The present invention relates to integrated circuits in general and, in particular, to optimized delay cells for voltage-controlled oscillators.

A voltage-controlled oscillator (VCO) is a key component in a typical phase-lock loop, or PLL. Along with a phase-frequency detector, a charge pump, and a loop filter, a VCO is capable of generating a clock whose frequency and phase have a well-defined (deterministic) relationship to the frequency and phase of a reference clock. As a set, they form the PLL. PLLs are used in various applications such as clock synthesis, clock distribution, signal de-skewing, and as filters in reducing jitter within other applications. VCOs therefore, are a commonly occurring circuit element in clock circuitry.

BRIEF SUMMARY

Among other advantages and features, the VCO, according to an embodiment of the invention, provides a number of differential delay cells and a configurable voltage generator. The voltage generator provides a number of reference voltage levels which are provided to the delay cells. The delay cells form an oscillator loop. With the reference voltage levels supplied from the voltage generator, stable operation of the voltage-controlled oscillator is produced. The number of differential delay cells is coupled in series and to the voltage generator. Each of the differential delay cells includes a first and second pull-up device cross coupled to one another and are further coupled to a plurality of current sources. The number of current sources is each supplied with one of the number of reference voltage levels and is configured to produce a reference magnitude of current. The cross coupled pull-up devices are instrumental in providing complementary output signaling from each delay cell. A pair of cascode current generators is configured in parallel and produces a magnitude current according to an applied reference voltage level from the voltage generator.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION

Among other things, systems and methods are described for providing voltage-controlled oscillator (VCO) functionality having a number of differential delay cells and a configurable voltage generator. The VCO functionality may be implemented, along with a phase-frequency detector, a charge pump, and a loop filter, as a phase-lock loop (PLL) capable of generating a clock whose frequency and phase have a well-defined (e.g., deterministic) relationship to the frequency and phase of a reference clock. Embodiments described herein provide support for wide ranges of frequencies and current levels.

Figure 2A:
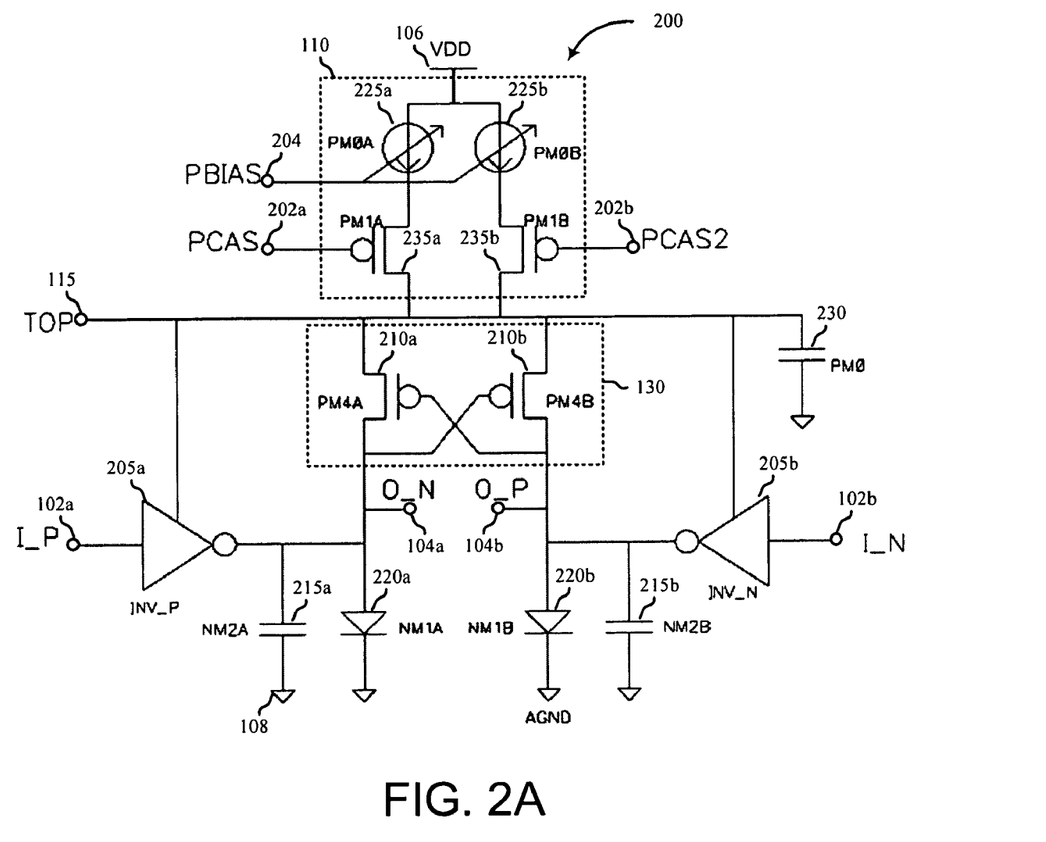
FIG. 2A shows a simplified schematic diagram of an embodiment of a delay cell, like the one shown in FIG. 1, according to various embodiments of the invention.
Figure 2B:
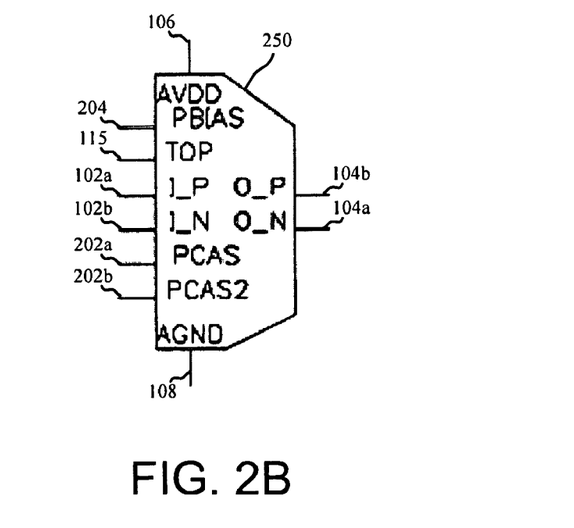
FIG. 2B shows a VCO delay cell symbol for use in schematic diagrams, according to an embodiment of a delay cell, like the one shown in FIG. 2A.
Figure 3:
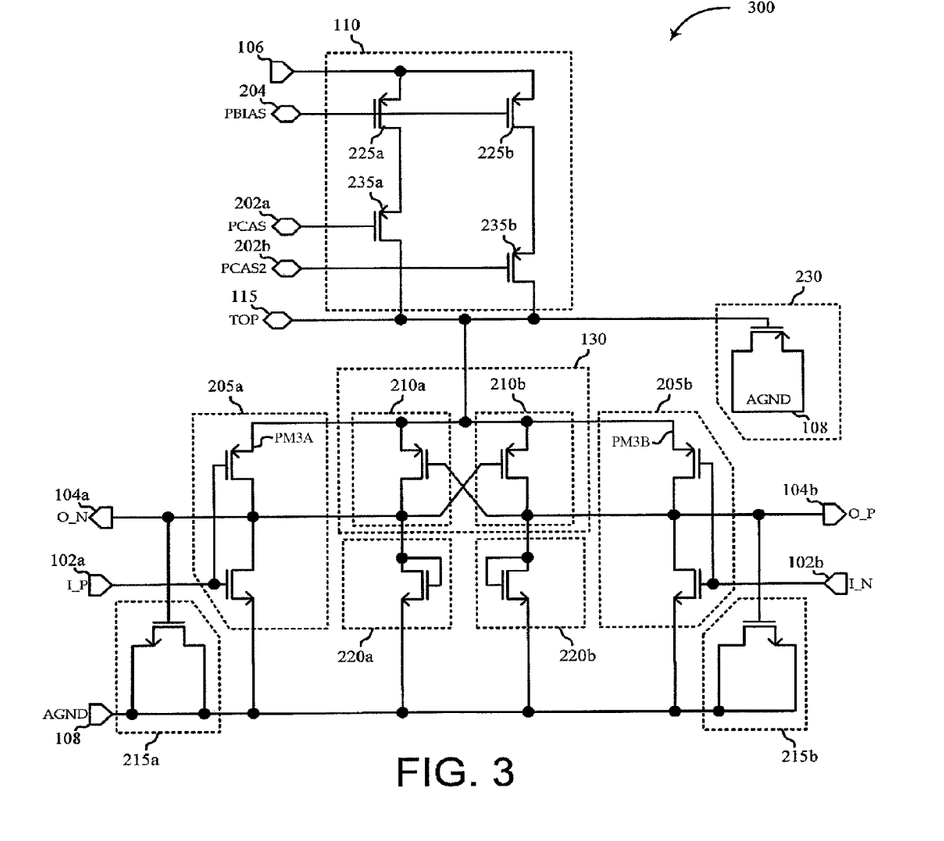
FIG. 3 shows transistor-based circuit implementation of an embodiment of a delay cell schematic, according to an embodiment of the invention.

A central component of VCO functionality (e.g., for use in a PLL) is the provision of delay. For example, multiple delay cells may be used in a ring oscillator configuration to provide VCO functionality. In some embodiments, each delay cell receives an input signal (e.g., an output from an adjacent delay cell) and generates a phase-shifted output signal. An embodiment of a delay cell for providing VCO functionality is shown in FIGS. 1-3.

Figure 1:
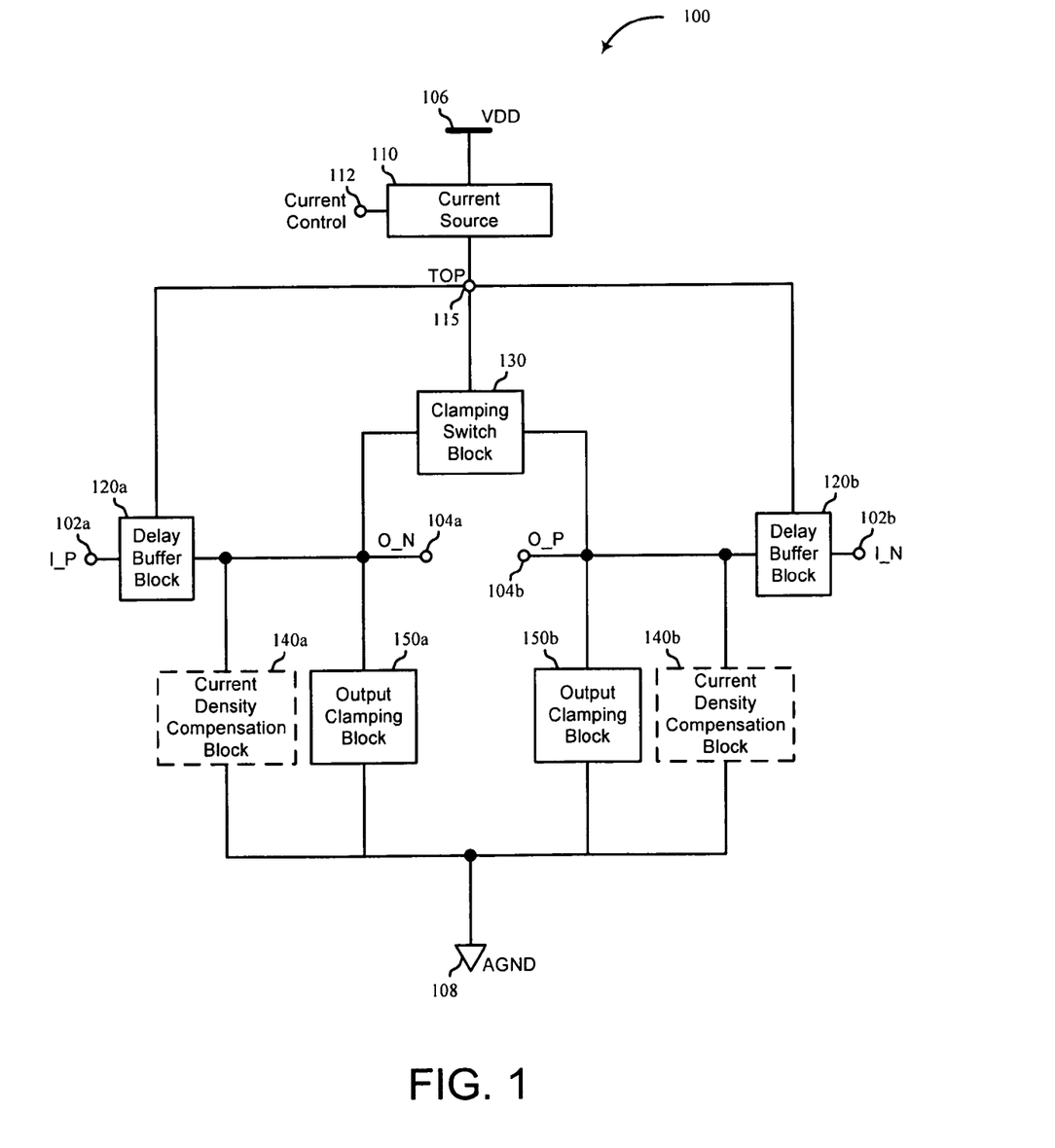
FIG. 1 shows a simplified block diagram of a delay cell for use in providing VCO functionality, according to various embodiments of the invention.

FIG. 1 shows a simplified block diagram of a delay cell 100 for use in providing VCO functionality, according to various embodiments of the invention. The delay cell 100 includes a current source 110, two delay buffer blocks 120, a clamping switch block 130, and two output clamping blocks 150. Some embodiments include two current density compensation blocks 140.

The current source 110 is coupled between a source voltage, VDD 106, and a TOP terminal 115. Embodiments of the current source 110 are configured to provide a programmable, substantially constant current to flow through the TOP terminal 115. The current source 110 is programmable by a current control input 112. In some embodiments, the current control input 112 includes a bias voltage, and/or additional signals for controlling the amount of current sourced by the current source 110.

Power to each delay buffer block 120 is tied to the TOP terminal 115. In some embodiments, input signals 102 are received at inputs to each delay buffer block 120. The delay buffer block 120 then generates an output signal 104 as a function of the input signal 102. For example, a first input signal 102a is received at an input of the first delay buffer block 120a, which generates a first output signal 104a; and a second input signal 102b, the complement to the first input signal 102a, is received at an input to the second delay buffer block 120b, which generates a second output signal 104b.

In some embodiments, each delay buffer block 120 includes a number of transistors and/or other components configured as an inverter, whereby its respective output signal 104 has an inverted relationship to the input signal 102. In other embodiments, components of each delay buffer block 120 delay the input signal 102 (e.g., due to propagation delay of the delay buffer block 120 components), buffer the input signal 102 (e.g., to isolate the input signal from effects of other components of the delay cell 100 by providing high output impedance), and/or to assist with TOP clamping, as described below.

The output signal 104 coming from each delay buffer block 120 may be clamped by a respective output clamping block 150. Each output clamping block 150 is coupled between the output signal 104 of its respective delay buffer block 120 and ground 108 (e.g., analog ground). The output signal 104, and therefore one side of the output clamping block 150, may be indirectly coupled with the TOP terminal 115 (e.g., through the clamping switch block 130), such that the output clamping block 150 can assist with both output clamping and TOP clamping, as described below.

Embodiments of the clamping switch block 130 are coupled between the TOP terminal 115 and each output signal 104. In some embodiments, the clamping switch block 130 includes transistors in a latch configuration. Typically, the second input signal 102b is the complement of the first input signal 102a, causing the second output 104b to be the complement of the first output 104a (e.g., to support use of the delay cell 100 in a ring oscillator configuration). The clamping switch block 130 may be configured to ensure this complementary relationship between the signals. For example, when the first output signal 104a goes HIGH, the clamping switch block 130 may force the second output signal 104b to pull LOW, and vice versa.

In certain embodiments, the clamping switch block 130 is further configured to assist with TOP clamping. It will be appreciated that a minimum voltage differential may be required between VDD 106 and the TOP terminal 115 to maintain desirable operation of the current source 110. For example, it may be desirable to run the current source 110 in its saturated region (e.g., for optimized efficiency, noise characteristics, etc.). When the voltage at the TOP terminal 115 comes too close to VDD 106, the current source 110 may not operate in saturation, potentially yielding sub-optimal or undesirable results. As the current being sourced by the current source 110 increases, the voltage at the TOP terminal 115 may be pulled toward VDD 106. It may, therefore, be desirable to clamp the TOP terminal 115 to maintain a maximum voltage level sufficiently below VDD 106 over a desirably large range of output currents from the current source 110. Components of the clamping switch block 130, the delay buffer block 120 (e.g., PMOS transistors), and/or the output clamping block 150 may assist with clamping the TOP terminal 115 voltage level.

Some embodiments of the delay cell 100 include current density compensation blocks 140. When using the delay cell 100 over large ranges of frequencies, it may be desirable to adapt the current source 110 output for optimized performance. For example, at high frequencies, increased current may allow for decreased phase noise and more optimal performance. However, changing the current through components of the delay cell 100 may also affect the delay provided by the delay cell 100. As such, embodiments of the current density compensation blocks 140 compensate for changes in current density to limit the effect of changes in current on delay provided by the delay cell 100. Typically, each current density compensation block 140 may be coupled between its respective output signal 104 and ground 108.

It will be appreciated that many implementations of the functionality of the delay cell 100 in FIG. 1 are possible, according to various embodiments. One exemplary implementation is shown in FIG. 2A. FIG. 2A shows a simplified schematic diagram of an embodiment of a delay cell 200, like the delay cell 100 shown in FIG. 1, according to various embodiments of the invention.

The delay cell 200 includes a first input 102a and a second input 102b coupled to a first inverter 205a and a second inverter 205b, respectively. Embodiments of the inverters 205 may implement functionality of the delay buffer blocks 120 of FIG. 1. Each inverter 205 is coupled to a core circuitry supply node, TOP node 115. In some embodiments, full inverters (e.g., inverters using multiple transistors) are used to provide improved clamping of TOP node 115, as described above.

Outputs of the first inverter 205a and the second inverter 205b couple to outputs of a first pull-up PMOS transistor 210a and a second pull-up PMOS transistor 210b, respectively. The first pull-up PMOS transistor 210a and the second pull-up PMOS transistor 210b are cross-coupled between a first output node 104a and a second output node 104b. Source nodes of the first pull-up PMOS transistor 210a and the second pull-up PMOS transistor 210b couple to a core circuitry supply node, TOP node 115. Control input nodes of the first pull-up PMOS transistor 210a and the second pull-up PMOS transistor 210b couple to the second output node 104b and the first output node 104a, respectively. In some embodiments, the first pull-up PMOS transistor 210a and the second pull-up PMOS transistor 210b implement some or all of the functionality of the clamping switch block 130 of FIG. 1.

The first output node 104a further couples to a first capacitor 215a and a first diode 220a. The second output node 104b further couples to a second capacitor 215b and a second diode 220b. In some embodiments, the first capacitor 215a and the second capacitor 215b implement functionality of the first current density compensation block 140a and the second current density compensation block 140b of FIG. 1, respectively. Further, in some embodiments, the first diode 220a and the second diode 220b implement functionality of the first output clamping block 150a and the second output clamping block 150b of FIG. 1, respectively. It will be appreciated that other components may be used to implement substantially the same functionality of the capacitors 215 and diodes 220. For example, each functional component or block of components may be implemented using transistors (e.g., as shown below in FIG. 3).

A voltage reference node VDD 106 couples to inputs of a first current source 225a and a second current source 225b. Control inputs of the first current source 225a and the second current source 225b couple to a bias-voltage node PBIAS 204. Output nodes of the first current source 225a and the second current source 225b couple to inputs of a first cascode switch 235a and a second cascode switch 235b, respectively. Control inputs of the first cascode switch 235a and the second cascode switch 235b couple to a first supply-select node PCAS2 202a and a second supply-select node PCAS2 202b, respectively. Outputs of the first cascode switch 235a and the second cascode switch 235b couple to TOP node 115.

In some embodiments, the first current source 225a, the second current source 225b, the first cascode switch 235a, and/or the second cascode switch 235b implement functionality of the current source 110 of FIG. 1. Further, in some embodiments, the bias-voltage node PBIAS 204, the first supply-select node PCAS 202a, and/or the second supply-select node PCAS2 202b are used as the current control input 112 in FIG. 1. Further, in some embodiments, TOP node 115 is coupled to ground 108 by a filter capacitor 230.

FIG. 2B shows a VCO delay cell symbol 250 for use in schematic diagrams. The VCO delay cell symbol 250 portrays various inputs, outputs, and power connections, according to an exemplary embodiment of a delay cell, like the delay cell 200 of FIG. 2A. Specifically, the VCO delay cell symbol 250 shows terminals corresponding to VDD 106, PBIAS 204, TOP node 115, the first input signal 102a, the second input signal 102b, PCAS 202a, PCAS2 202b, ground 108, the first output signal 104a, and the second output signal 104b.

It will be appreciated that many circuit components and topologies are possible for implementing the functionality of the delay cell 200 of FIG. 2A. For example, FIG. 3 shows transistor-based circuit implementation of an embodiment of a delay cell schematic 300, according to an embodiment of the invention. In some embodiments, the delay cell schematic 300 is implemented within an integrated circuit packaged substantially according to the delay cell symbol 250 shown in FIG. 2B. It will be appreciated by those of skill in the art that the component blocks of the delay cell schematic 300 constitute an illustrative embodiment of the delay cell 200 of FIG. 2A. As such, FIG. 3 is labeled with reference numerals corresponding to corresponding functional components of FIG. 2A.

Notably, the first pull-up device PM3A and the second pull-up device PM3B of the first inverter (INV_P) 205a and the second inverter (INV_N) 205b, respectively, may be relatively strong PMOS transistors, capable of providing a voltage limit for the TOP node 115. This may help clamp the TOP node 115, as discussed above. Clamping the TOP node 115 may ensure a minimum voltage across the first current source (PM0A) 225a and across the second current source (PM0B) 225b, ensuring the current sources maintain operation in a saturation region and making the respective supplied currents less sensitive to changes in the voltage at the TOP node 115 in relation to VDD 106.

The first pull-up PMOS transistor 210a and the second pull-up PMOS transistor 210b are cross-coupled transistors, which may serve at least two purposes. One purpose of the first pull-up PMOS transistor 210a and the second pull-up PMOS transistor 210b may be to force the first output node 104a and the second output node 104b to transition in a complementary mode. Another purpose of the first pull-up PMOS transistor 210a and the second pull-up PMOS transistor 210b may be to contribute to the clamping characteristics provided to the TOP node 115. The larger the sizes of the first pull-up PMOS transistor 210a and the second pull-up PMOS transistor 210b, the better the TOP node 115 may be clamped. In some embodiments, the first pull-up PMOS transistor 210a and the second pull-up PMOS transistor 210b implement functionality of the clamping switch block 130 of FIG. 2A.

The first capacitor (NM2A) 215a and the second capacitor (NM2B) 215b may reduce phase noise by operating related circuit structures at higher current densities for a given VCO frequency. The first diode (NM1A) 220a and the second diode (NM1B) 220b may provide additional clamping of the TOP node 115. As explained above, clamping of the TOP node 115 may increase a supply noise rejection quotient by virtue of maintaining a lower voltage at the TOP node 115, allowing the current sources 225 to operate at a larger voltage across them and producing high-output-impedance-current sources. As illustrated in FIG. 3, the capacitors 215 and/or the diodes 220 are implemented in certain embodiments using transistors. In one embodiment, each diode 220 is an NMOS transistor with a source node connected with ground 108 and a gate node and a drain node each connected with an output node 104. In another embodiment, each diode 220 is a PMOS transistor with a source node connected with a reference supply voltage level and a gate node and a drain node each connected with an output node 104.

A magnitude of transconductance of the first current source 225a and the second current source 225b, and corresponding output current value, may contribute to the determination of an operating frequency of the VCO. The first cascode switch 235a and the second cascode switch 235b form a cascode supply structure, which may create, in conjunction with the current sources 225, a high-output-impedance current source, which may provide enhanced noise rejection. The filter capacitor 230 may strongly couple the TOP node 115 to ground 108. The strong coupling may provide a more consistent core voltage (i.e., the voltage between the TOP node 115 and ground 108) in the presence of substrate and power-supply noise, and may produce better noise rejection functionality.

It will be appreciated that embodiments of delay cells, such as those shown in FIGS. 1-3, may provide a number of features. Some embodiments provide current sources in a cascode configuration (e.g., as shown in FIGS. 2A and 3), which may provide high power-supply-noise immunity. Other embodiments provide an ability to selectively apply current from an alternate cascode current branch (e.g., using the first supply-select node PCAS 202a and the second supply-select node PCAS2 202b of FIG. 2A). Switching in the extra current branch increases current provided to a delay cell, which may enable operation at higher current densities, resulting in the VCO having lower phase noise. For a given current in the delay cell, this may allow operation at a higher PBIAS level (see element 204 of FIG. 2A), which may maintain the high power-supply-noise rejection for situations with limited head-room voltage.

Other embodiments allow operation at high current levels with a resulting lower phase noise. Still other embodiments provide an ability to operate at high PBIAS voltages in cases of reduced voltage headroom and with fixed current requirements through each delay cell. Yet other embodiments provide a decoupling capacitor at the TOP voltage (e.g., filter capacitor 230 of FIG. 2A) for greater substrate noise immunity and high power-supply-noise rejection. Other embodiments provide capacitors at delay cell outputs (e.g., capacitors 215 of FIG. 2A) that may lower phase noise by providing more current when running at a given frequency. Still other embodiments provide clamping devices that limit the voltage level of TOP supply voltage and the delay cell output voltages resulting in higher power supply-noise rejection (e.g., components of the clamping switch block 130, the delay buffer block 120, and/or the output clamping block 150 of FIG. 1). Yet other embodiments provide cross-coupled PMOS structure (e.g., the first pull-up PMOS transistor 210a and the second pull-up PMOS transistor 210b of FIGS. 2A and 3) that produce a complementary transition at the delay cell output and further reduces transition time of output signals.

Figure 4:
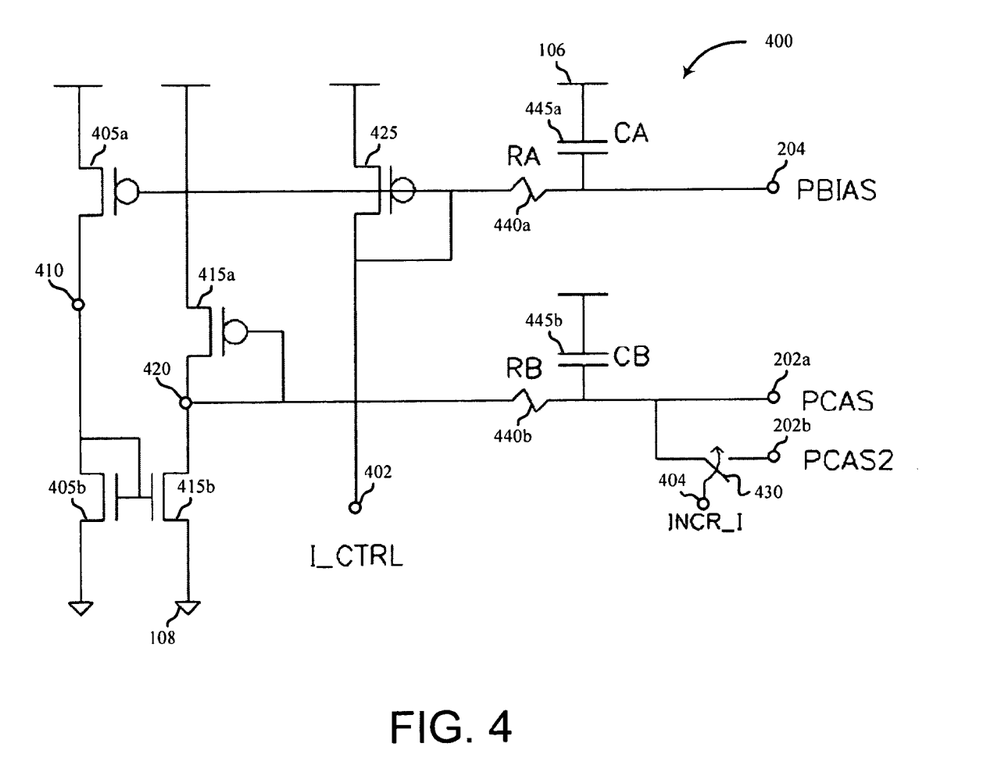
FIG. 4 shows a simplified schematic diagram of an embodiment of a configurable voltage generator, according to various embodiments of the invention.

Some embodiments provide a configurable voltage generator for controlling certain components of the delay cell. For example, it may be desirable to generate the current control input 112 signal(s) of FIG. 1 (e.g., the bias-voltage node PBIAS 204, the first supply-select node PCAS 202a, and/or the second supply-select node PCAS2 202b) using a configurable voltage generator. FIG. 4 shows a simplified schematic diagram of an embodiment of a configurable voltage generator 400, according to various embodiments of the invention.

Embodiments of the configurable voltage generator 400 generate signals for use by a delay cell, like the delay cell 200 shown in FIG. 2A, including signals desired as the bias-voltage node PBIAS 204, the first supply-select node PCAS 202a, and/or the second supply-select node PCAS2 202b of the delay cell 200. The configurable voltage generator 400 includes a mirror pull-up device 405a and a reference pull-down device 405b that are coupled in series at a first series-coupling node 410 and between a source voltage, VDD 106 and ground 108. A first reference pull-up device 415a and a pull-down-mirror device 415b are coupled in series at a second series-coupling node 420 and between VDD 106 and ground 108. The first series-coupling node 410 is coupled to a control input of the first pull-down-mirror device 415b.

A second reference pull-up device 425 couples to VDD 106 and a current-control node 402. For example, a current control device may couple to the current-control node 402. The current-control node 402 couples to a control input of the mirror pull-up device 405a and an input of a first resistor 440a. An output node of the first resistor 440a couples to a first noise-filter capacitor 445a and a bias-output node 204. Together, the first resistor 440a and the first noise-filter capacitor 445a may form a low-pass filter to reduce noise coupled to a ring oscillator coupled with the configurable voltage generator 400 through the bias-output node 204. The first noise-filter capacitor 445a couples between VDD 106 and the bias-output node 204.

The second series-coupling node 420 couples to an input of a second resistor 440b. An output node of the second resistor 440b couples to a second noise-filter capacitor 445b, the first supply-select node 202a, and a current-increase switch 430. The second noise-filter capacitor 445b couples between VDD 106 and the first supply-select node 202a. The current-increase switch 430 couples between the first supply-select node 202a and the second supply-select node 202b. A switch control input of the current-increase switch 430 couples to an increase-current node 404. Together, the second resistor 440b and the second noise-filter capacitor 445b may form a low-pass filter to reduce noise coupled to a ring oscillator coupled with the configurable voltage generator 400 through the first supply-select node 202a and the second supply-select node 202b (through the current-increase switch 430).

In some VCO embodiments, the configurable voltage generator 400 is in communication with at least one delay cell, like the delay cell 200 of FIG. 2A, via the bias-output node 204, the first supply-select node 202a, and the second supply-select node 202b. A voltage seen at the bias-output node 204 contributes to a magnitude of current available for coupling through the first cascode switch 235a and/or the second cascode switch 235b (e.g., as partially determined by switching the second supply-select node 202b using the current-increase switch 430). The clamping structure of the first diode 220a and the second diode 220b at a given frequency may determine the current available for coupling at the cascode switches 235 and may determine the operating voltage level at the TOP node 115.

In certain embodiments, voltage levels seen by the configurable voltage generator 400 at the bias-output node 204, the first supply-select node 202a, and the second supply-select node 202b, are dependent on current produced at the current control node 402 of the configurable voltage generator 400. The current produced at the current control node 402 may determine an operating frequency of the VCO. Increasing the magnitude of the current produced at the current control node 402 may decrease the magnitude of the voltage level seen on the bias-output node 204 and, thus, increase the current flowing through the one or more connected delay cells 200. Additionally, the voltage produced at the second supply-select node 202b can be switched on and off by applying an appropriate signal to the increase-current node 404 to switch the current-increase switch 430. For example, voltage is enabled at the second supply-select node 202b to reduce phase noise by providing higher current density through the delay cell(s) 200. It will now be appreciated that using the configurable voltage generator 400 in combination with one or more delay cells 200 may implement a VCO with a frequency that is controlled at least in part by the current at the current control node 402.

Figure 5A:
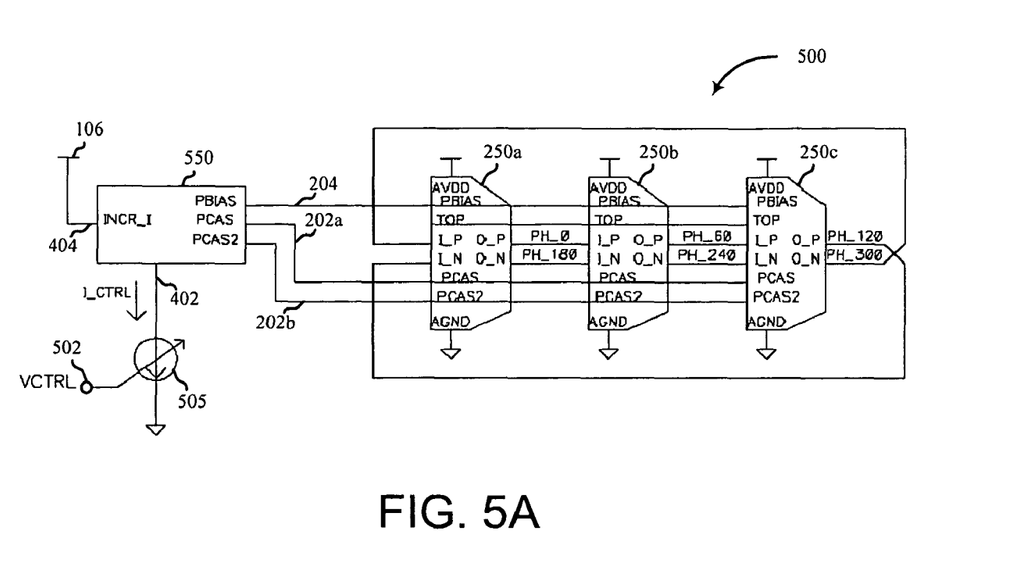
FIG. 5A, an embodiment of an odd-numbered-delay-cell ring oscillator is shown, having a configurable voltage generator in communication with three delay cells, according to an embodiment of the invention.
Figure 5B:
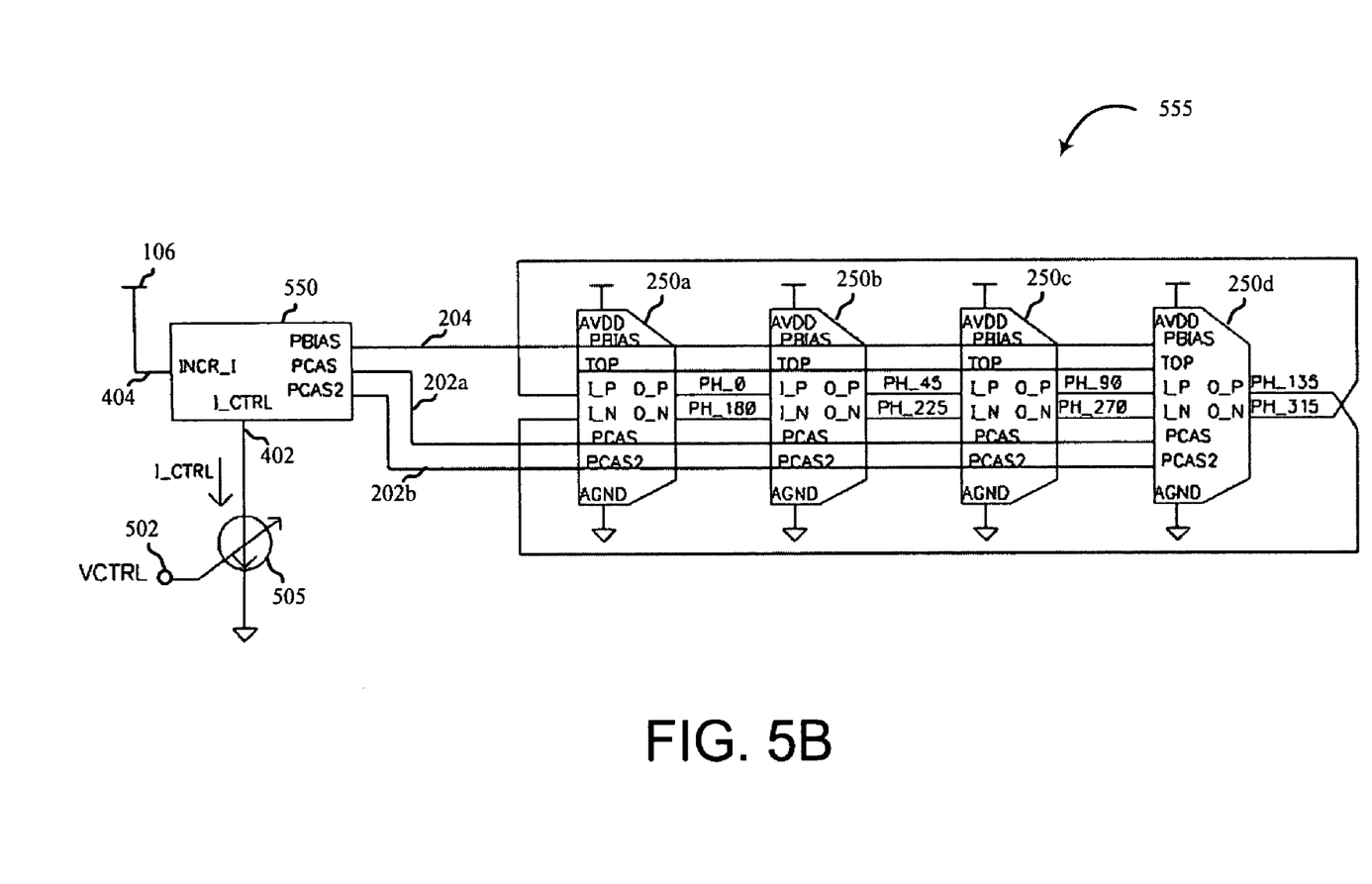
FIG. 5B shows an embodiment of an even-numbered-delay-cell ring oscillator, having a configurable voltage generator in communication with four delay cells, according to an embodiment of the invention.

Different embodiments of VCO implementations are possible, using a configurable voltage generator 400 in communication with a series of delay cells, according to various embodiments of the invention. Particularly, embodiments of delay cells can be used in either even numbers or odd numbers, to form ring oscillator configurations for providing delay in support of the VCO functionality. For example, embodiments provide the functionality to maintain, for odd-numbered-delay-cell ring oscillators, an odd number of inverters in any given signal path that results in a solid oscillation structure. FIGS. 5A and 5B show simplified block diagrams of an odd-numbered-delay-cell ring oscillator 500 and an even-numbered-delay-cell ring oscillator 555, respectively, according to various embodiments of the invention.

Turning first to FIG. 5A, an embodiment of an odd-numbered-delay-cell ring oscillator 500 is shown, having a configurable voltage generator in communication with three delay cells. Each delay cell is represented by a delay cell symbol 250, as described with reference to FIG. 2B above. The configurable voltage generator is represented by a configurable voltage generator symbol 550. The configurable voltage generator symbol 550 portrays various inputs, outputs and power connections, according to an embodiment of a configurable voltage generator, like the configurable voltage generator 400 of FIG. 4. Specifically, the configurable voltage generator symbol 550 includes terminals corresponding to the increase-current node 404, the current-control node 402, the bias-output node 204, the first supply-select node 202a, and the second supply-select node 202b of FIG. 4.

As shown, a current control device 505 is in communication with the current control node 402 of the voltage generator symbol 550, and has a voltage-control input node 502. Using the current control device 505, the current at the current control node 402 may be controlled by adjusting a voltage level applied to the voltage-control input node 502. In one embodiment, the current control device 505 is a MOS transistor with a transconductance characteristic determined by a voltage on the voltage-control input node 502. The voltage on the voltage-control input node 502 may be directly related to the current flowing through the second reference pull-up device (e.g., element 225 of FIG. 2A), which may directly determine a voltage level on the bias-output node 204. Also as shown, the increase-current node 404 is tied to VDD 106. This may increase the current density of the delay cell symbols 250 by enabling the second supply-select node 202b. It will be appreciated that other signals may be applied to the voltage-control input node 502 and/or the increase-current node 404 in different embodiments or applications, as desired.

The bias-output node 204, the first supply-select node 202a, and the second supply-select node 202b are connected in parallel from the voltage generator symbol 550 to each of the delay cell symbols 250. Further, the output nodes (O_P and O_N) of each delay cell symbol 250 are in communication with respective input nodes (I_P and I_N) of an adjacent delay cell symbol 250. It will be appreciated that this configuration of the voltage generator symbol 550 in communication with the delay cell symbols 250*a*, 250*b*, and 250*c* may be used to implement a three-stage VCO.

For example, each of the three delay cell symbols 250 in the ring-oscillator configuration shifts the phase of its input signal by negative 120 degrees. As such, the three delay cell symbols 250 form two complementary rings, with oscillating phase sequence characteristics. Specifically, the first ring can be illustrated as beginning with a 0-degree-phase signal at the O_P output of the first delay cell symbol 250*a* and the I_P input of the second delay cell symbol 250*b*. The second delay cell symbol 250*b* phase-shifts the signal, outputting a 240-degree-phase signal at the O_N output of the second delay cell symbol 250*b* and the I_N input of the third delay cell symbol 250*c*. The third delay cell symbol 250*c* phase-shifts the signal, outputting a 120-degree-phase signal at the O_P output of the third delay cell symbol 250*c* and the I_N input of the first delay cell symbol 250*a*. The first delay cell symbol 250*a* phase-shifts the signal, outputting the same 0-degree-phase signal at the O_P output of the first delay cell symbol 250*a* and the I_P input of the second delay cell symbol 250*b* with which the first ring began.

In a complementary fashion, the second ring can be illustrated as beginning with a 180-degree-phase signal at the O_N output of the first delay cell symbol 250*a* and the I_N input of the second delay cell symbol 250*b*. The second delay cell symbol 250*b* phase-shifts the signal, outputting a 60-degree-phase signal at the O_P output of the second delay cell symbol 250*b* and the I_P input of the third delay cell symbol 250*c*. The third delay cell symbol 250*c* phase-shifts the signal, outputting a 300-degree-phase signal at the I_N output of the third delay cell symbol 250*c* and the I_P input of the first delay cell symbol 250*a*. The first delay cell symbol 250*a* phase-shifts the signal, outputting the same 180-degree-phase signal at the O_N output of the first delay cell symbol 250*a* and the I_N input of the second delay cell symbol 250*b* with which the second ring began. Notably, each phase propagation path (i.e., each ring) has a robust start-up structure with an odd number of delay cell symbols 250, which produces complementary switching between phases according to, for example, cross coupled PMOS transistors 210 of FIG. 2A. According to embodiments of the invention, a similarly robust start-up structure may be achieved with an even number of delay cell symbols 250, as illustrated in FIG. 5B.

FIG. 5B shows an embodiment of an even-numbered-delay-cell ring oscillator 555, having a configurable voltage generator in communication with four delay cells. As in FIG. 5A, each delay cell is represented by a delay cell symbol 250, and the configurable voltage generator is represented by a configurable voltage generator symbol 550. A current control device 505 is in communication with the current control node 402 of the voltage generator symbol 550, and has a voltage-control input node 502. The bias-output node 204, the first supply-select node 202*a*, and the second supply-select node 202*b* are connected in parallel from the voltage generator symbol 550 to each of the delay cell symbols 250. Further, the output nodes (O_P and O_N) of each delay cell symbol 250 are in communication with respective input nodes (I_P and I_N) of adjacent delay cell symbols 250. It will be appreciated that this configuration of the voltage generator symbol 550 in communication with the delay cell symbols 250*a*, 250*b*, 250*c*, and 250*d* may be used to implement a four-stage VCO.

For example, each of the four delay cell symbols 250 in the ring-oscillator configuration shifts the phase of its input signal by negative 135 degrees. As configured, complete propagation through the ring includes propagation through the four delay cell symbols 250 twice, causing eight 135-degree phase shifts (i.e., 1080-degrees of total phase shift, or 3 complete 360-degree oscillations). Specifically, the ring can be illustrated as beginning with a 0-degree-phase signal at the O_P output of the first delay cell symbol 250*a* and the I_P input of the second delay cell symbol 250*b*. The second delay cell symbol 250*b* phase-shifts the signal, outputting a 225-degree-phase signal at the I_N input of the third delay cell symbol 250*c*. The third delay cell symbol 250*c* phase-shifts the signal, outputting a 90-degree-phase signal at the I_P input of the fourth delay cell symbol 250*d*. The fourth delay cell symbol 250*d* phase-shifts the signal, outputting a 315-degree-phase signal at the O_N output of the fourth delay cell symbol 250*d* and the I_P input of the first delay cell symbol 250*a*. The first delay cell symbol 250*a* phase-shifts the signal, outputting a 180-degree-phase signal at the I_N input of the second delay cell symbol 250*b*. The second delay cell symbol 250*b* phase-shifts the signal, outputting a 45-degree-phase signal at the I_P input of the third delay cell symbol 250*c*. The third delay cell symbol 250*c* phase-shifts the signal, outputting a 270-degree-phase signal at the I_N input of the fourth delay cell symbol 250*d*. The fourth delay cell symbol 250*d* phase-shifts the signal, outputting a 135-degree-phase signal at the O_P output of the fourth delay cell symbol 250*d* and the I_N input of the first delay cell symbol 250*a*. The first delay cell symbol 250*a* phase-shifts the signal, outputting the same 0-degree-phase signal at the I_P input of the second delay cell symbol 250*b* with which the ring began.

It will be appreciated that the above mentioned exemplary embodiments of VCO implementations may represent a minimum configuration of elements forming a VCO. In practice, there may be additional blocks allowing programmability of a VCO. For example, embodiments may include or be in communication with components configured to control frequency gain (e.g., degree of sensitivity of the frequency to changes in the voltage at the voltage-control input node 502) or to provide frequency offset. It will be further appreciated that the VCO functionality (e.g., as illustrated in FIGS. 1-5) may be integrated as a component of a circuit arrangement.

Figure 6:
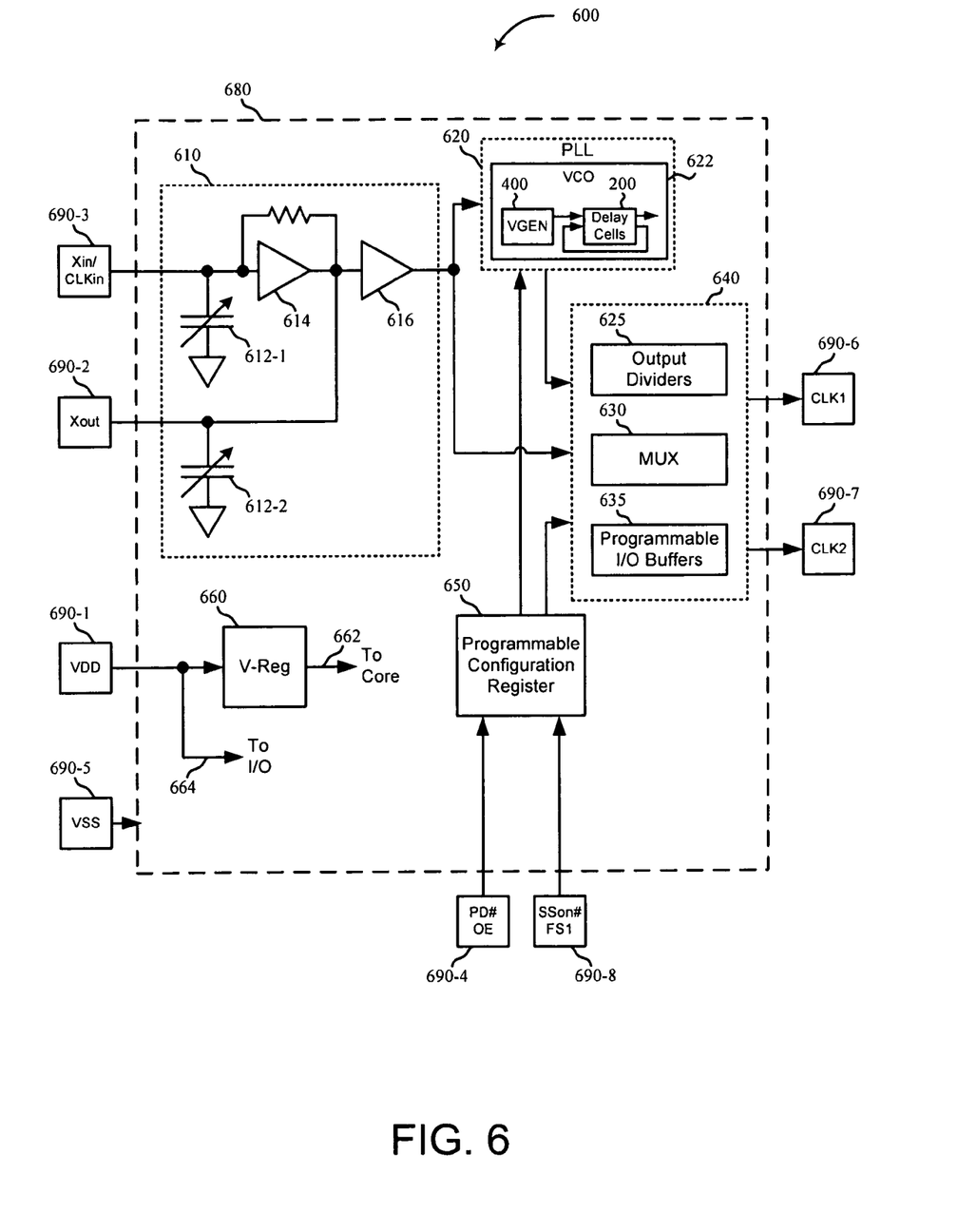
FIG. 6 shows a simplified block diagram of a circuit arrangement using a VCO, according to various embodiments of the invention.

FIG. 6 shows a simplified block diagram of a circuit arrangement 600 using a VCO, according to various embodiments of the invention, as part of a phase-lock loop (PLL). The circuit arrangement 600 is shown as an integrated circuit component 680 with a number of pins 690. Each of the pins provides certain input/output functionality, and may be optimized according to its function. For example, the $V_{DD}$ pin 690-1 and the $V_{SS}$ pin 690-5 may be metalized as power pins.

The circuit arrangement 600 includes a reference control block 610, a phase-lock loop (PLL) block 620, an I/O control block 640, a programmable configuration register block 650, and a power conditioning block 660. In some embodiments, a crystal oscillator or other clock source is in communication with the $X_{IN}$ pin 690-3 and the $X_{OUT}$ pin 690-2. In one embodiment, variable capacitance elements 612 are used to tune the external clock source (e.g., when a crystal or ceramic oscillator is used). A gain stage 614, buffer 616, and/or other components of the reference control block 610 may be used to further control the output of the reference clock control block 610 to generate a master clock signal for use by other blocks of the circuit arrangement 600. In some embodiments, the output of the reference control block 610 is used as a master clock signal for the PLL block 620.

The PLL block 620 is programmable to provide a reference clock signal as a function of the frequency and/or phase of the output of the reference control block 610. For example, the PLL block 620 uses negative feedback to maintain a stable reference clock signal that is mathematically related to the master clock signal. In some embodiments, the PLL block 620 includes a VCO 622. As described above, embodiments of the VCO include a configurable voltage generator 400 (e.g., as described with reference to FIG. 4) and a set of delay cells 200 (e.g., as described with reference to FIG. 2A). For example, the VCO may be configured according to the odd-numbered-delay-cell ring oscillator 500 embodiment of FIG. 5A or the even-numbered-delay-cell ring oscillator 555 of FIG. 5B.

Embodiments of the programmable configuration register block 650 provide configuration signals for use by various components of the circuit arrangement 600. The programmable configuration register block 650 may include a number of programmable registers distributed throughout the integrated circuit. For example, the registers may provide distributed, small-scale, volatile memory that are set by a centralized non-volatile memory on power-up. In one embodiment, the programmable configuration register block 650 is affected in part by input pins, including a PD#/OE pin 690-4 and an SSon#/FS 1 pin 690-8. For example, the PD#/OE pin 690-4 provides either a Power Down signal (e.g., if PD#=0 (Low), the device is powered down and both SSCLK and REFOUT outputs are weakly pulled low to VSS) or an Output Enable signal (e.g., if OE=1(High)), the SSCLK and REFOUT outputs are enabled; and the SSon#/FS1 pin 690-8 provides either a Programmable Spread Spectrum ON signal (e.g., if SSon#=0 (Low), spread spectrum clocking is on, and if SSon#=1 (High), spread spectrum clocking is off) or a Frequency Select signal (e.g., if FS function is programmed, the clock frequencies can be switched between two sets of frequencies, as programmed).

In some embodiments of the circuit arrangement 600, outputs from the reference control block 610, the PLL block 620, and the programmable configuration register block 650 are passed to the I/O control block 640. Embodiments of the I/O control block 640 include an output divider block 625, a multiplexer (mux) block 630, and a programmable I/O buffer block 635. The component blocks of the I/O control block 640 are used to control the characteristics and operation of I/O terminals, like the CLK1 pin 690-6 and the CLK2 pin 690-7. For example, the programmable I/O buffer block 635 may be implemented according to embodiments described in U.S. patent application Ser. No. 12/370,163, filed Feb. 12, 2009, entitled "PROGRAMMABLE IO ARCHITECTURE", which is hereby incorporated by reference in its entirety for all purposes.

It will be appreciated that other functionality may be provided by embodiments of the circuit arrangement 600. In some embodiments, the power conditioning block 660 is included to provide certain power management and/or conditioning functionality. In the embodiment shown, the $V_{DD}$ pin 690-1 ins coupled with the power conditioning block 660. The power conditioning block 660 then generates an I/O power signal 664 and a core power signal 662, providing appropriate power for driving various I/O and core components, respectively. For example, the integrated circuit 680 may be coupled, via the $V_{DD}$ pin 690-1, with a 3.8-volt supply. The power conditioning block 660 may be used to convert the 3.8-volt source voltage to a 1.8-volt signal, which may be desired for use by various components of the circuit arrangement 600.

Figure 7:
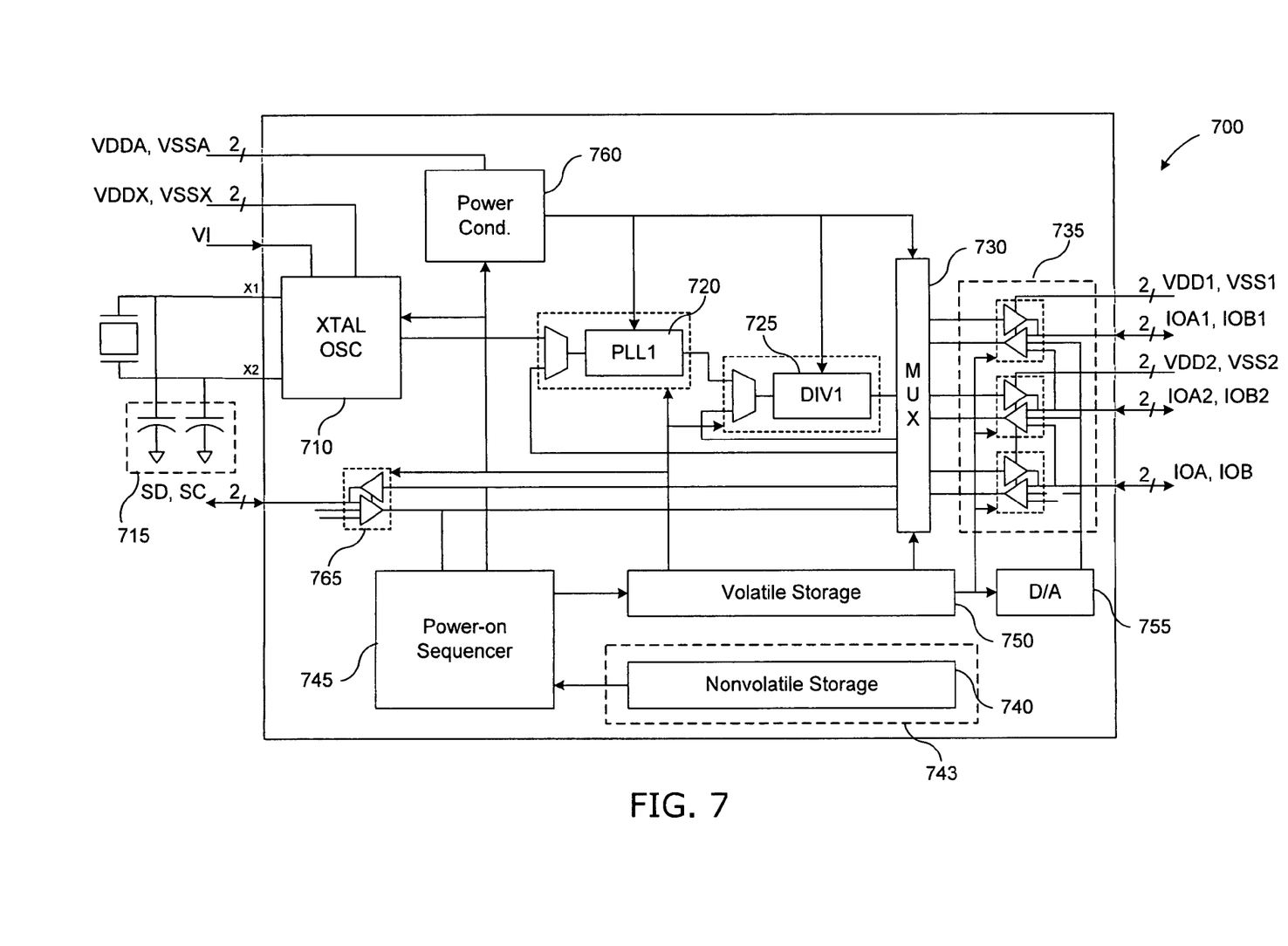
FIG. 7 illustrates another simplified block diagram of a clock circuit arrangement, for use with various embodiments of the invention.

FIG. 7 illustrates another simplified block diagram of a circuit arrangement 700, for use with various embodiments of the invention. An external crystal couples to a voltage controlled crystal oscillator (VCXO) 710 in an exemplary embodiment. A pair of capacitors 715 couple crystal oscillator inputs X1, X2 to ground. VCXO power (VDDX), VCXO ground (VSSX), and VCXO input voltage (VI) are external inputs to the VCXO 710. In some embodiments, the VCXO 710 is implemented as the reference control block 410 of FIG. 6.

An output of the VCXO 710 is connected with an input multiplexer (mux) of a phase lock loop (PLL1) 720, providing a reference signal for the PLL 720. Embodiments of the first phase lock loop 720 are implemented as block 620 of FIG. 6. In other embodiments, additional PLLs 720 may be used to allow for additional I/Os and further programmability. An output of the phase lock loop 720 is connected with an input multiplexer (mux) of a PLL divider (DIV1) 725. An output of the PLL divider 725 is fed to a MUX 730. A first set of outputs of the MUX 730 are connected with programmable input/output buffers 735. Additional outputs from the MUX 730 may be connected with the input mux of PLL1 720 and the input mux of the PLL divider 725. Embodiments of the PLL divider 725, the MUX 730, and the programmable input/output buffers 735 are implemented as the output divider block 625, mux block 630, and programmable I/O buffer block 635, respectively, of the I/O control block 640 of FIG. 6.

The clock generator circuit 700, including a nonvolatile storage array 740, may be fabricated, for example, in a single monolithic semiconductor substrate or alternately, the nonvolatile storage array 740 may reside on a second semiconductor substrate 743. An output of the nonvolatile storage array 740 may be in communication with a power-on sequencer 745. The power-on sequencer 745 may communicate with a volatile storage array 750. In some embodiments, portions of the nonvolatile storage array 740, the power-on sequencer 745, and/or the volatile storage array 750 are implemented as the programmable configuration register block 650 of FIG. 6.

The volatile storage array 750 is in communication with a digital-to-analog (D/A) block 755, a power conditioner block 760, a serial I/O block 765, the programmable input/output buffers 735, the mux 730, the PLL 720, the PLL divider 725, and the VCXO 710. The serial I/O block 765 communicates with serial data and serial clock inputs SD, SC, the power-on sequencer 745, and the MUX 730. The power conditioner block 760 is connected with PLL power inputs VDDA, VSSA. In some embodiments, the power conditioner block 760 is implemented as the power conditioning block 660 of FIG. 6.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems and methods may individually or collectively be components of a larger system, wherein other procedures may take precedence over or otherwise modify their application. Also, a number of steps may be required before, after, or concurrently with the following embodiments. Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, which is defined by the appended claims.

What is claimed is:

1. A voltage-controlled ring oscillator comprising:
   a plurality of differential delay cells coupled in series to one another and each of the plurality of differential delay cells coupled to a voltage generator, each differential delay cell further comprising:
      a first pull-up device and a second pull-up device cross-coupled to one another; and
      a current source module comprising a plurality of current source sub-modules coupled to the first pull-up device and the second pull-up device, each of the plurality of current source sub-modules comprising a current source and a switch connected in series with the respective current source, each of the plurality of current source sub-modules supplied with one of a plurality of reference voltage levels and configured to produce a reference magnitude of current; and
   the voltage generator configured to provide the plurality of reference voltage levels to the current source module based at least in part on first and second control signals provided to the voltage generator.

2. The voltage-controlled ring oscillator of claim 1, wherein a magnitude of current produced by each of the plurality of current sources is configured with electrical reference to a reference supply voltage level and each one of the plurality of differential delay cells further comprises a plurality of delay cell outputs each electrically clamped with a diode coupled to ground.

3. The voltage-controlled ring oscillator of claim 2, wherein each diode is an NMOS transistor with a source node coupled to ground and a gate node and a drain node each coupled to a corresponding one of the plurality of delay cell outputs.

4. The voltage-controlled ring oscillator of claim 2, wherein the first pull-up device and the second pull-up device are cross-coupled PMOS transistors having respective source nodes coupled to an output node of the plurality of current sources, wherein a gate node of the second pull-up device and a drain node of the first pull-up device are coupled to a first delay cell output of the plurality of delay cell outputs, and wherein a gate node of the first pull-up device and a drain node of the second pull-up device are coupled to a second delay cell output of the plurality of delay cell outputs.

5. The voltage-controlled ring oscillator of claim 1, wherein a magnitude of current produced by each current source is configured with electrical reference to ground and each of the plurality of differential delay cells further comprises an output clamped with a diode coupled to a reference supply voltage level.

6. The voltage-controlled ring oscillator of claim 5, wherein each diode is a PMOS transistor with a source node coupled to a reference supply voltage level and a gate node and a drain node each coupled to a corresponding one of the plurality of delay cell outputs.

7. The voltage-controlled ring oscillator of claim 5, wherein the first pull-up device and the second pull-up device are NMOS transistors and cross-coupled with respective source nodes coupled to an input node of the plurality of current sources, a gate node of the second pull-up device and a drain node of the first pull-up device are coupled to a first differential delay cell output node, and a gate node of the first pull-up device and a drain node of the second pull-up device are coupled to a second differential delay cell output node.

8. The voltage-controlled ring oscillator of claim 1, wherein each of the plurality of differential delay cells further comprises a plurality of output nodes each with at least one capacitor selectively coupled to ground, each of the at least one capacitors configured to have a capacitance corresponding to an expected magnitude of noise to be experienced.

9. The voltage-controlled ring oscillator of claim 8, wherein the at least one capacitor is selectively coupled to ground with a switch.

10. The voltage-controlled ring oscillator of claim 1, wherein a first node of each of the current sources is coupled to a first voltage supply that supplies each of the current sources.

11. The voltage-controlled ring oscillator of claim 10, wherein the first voltage supply further supplies the voltage generator.

12. The voltage-controlled ring oscillator of claim 1, wherein the first control signal adjusts a bias voltage supplied by the voltage generator to each of the current sources, and wherein the second control signal adjusts a control signal to at least one of the switches.

13. The voltage-controlled ring oscillator of claim 12, wherein the voltage generator includes:
   a first low pass filter formed by a first capacitor and a first resistor, the first low pass filter configured to generate the bias voltage supplied by the voltage generator to each of the current sources; and
   a second low pass filter formed by a second capacitor and a second resistor, the second low pass filter configured to generate multiple supply select signals, each of the multiple supply select signals to gate a respective one of the switches.

14. An apparatus comprising:
   a first delay buffer module, communicatively coupled with a reference voltage, and configured to receive a first input signal and to generate a first output signal at a first output node, the first output signal being generated as a function of the first input signal such that it is phase-shifted with respect to the first input signal;
   a second delay buffer module, communicatively coupled with the reference voltage, and configured to receive a second input signal and to generate a second output signal at a second output node, the second output signal being generated as a function of the second input signal such that it is phase-shifted with respect to the second input signal;
   a clamping switch module, communicatively coupled with the reference voltage, the first output node, and the second output node, and configured to:

functionally relate the first output signal with the second output signal such that the second output signal is substantially a complement of the first output signal; and clamp the reference voltage to maintain at least a minimum voltage differential between the reference voltage and a source voltage;

a current source module, communicatively coupled between the source voltage and the reference voltage and responsive to a plurality of reference voltage levels, and configured to source current to the first delay buffer module, the second delay buffer module, and the clamping switch module, the current source module comprising at least a first current source and a switch connected in series with the first current source; and a voltage generator configured to provide the plurality of reference voltage levels to the current source module based at least in part on first and second control signals provided to the voltage generator.

15. The apparatus of claim 14,
wherein the clamping switch module comprises a cross-coupled pair of transistors.

16. The apparatus of claim 14,
wherein the minimum voltage differential between the reference voltage and a source voltage is a voltage at which the current source module operates in a saturated region.

17. The apparatus of claim 16,
wherein the current source module is controllable by at least one current control signal, wherein the current source sources an amount of current as a function of the at least one current control signal.

18. The apparatus of claim 17,
wherein the at least one current control signal comprises a bias output signal, a first supply select signal, and a second supply select signal.

19. The apparatus of claim 18,
wherein the first supply select signal is configured to enable the first current source, and the second supply select signal is configured to enable a second current source.

20. The apparatus of claim 14, further comprising:
an output clamping module, communicatively coupled with the first output node, configured to clamp the output signal.

21. The apparatus of claim 20,
wherein the output clamping module is further configured to contribute to clamping the reference voltage to ensure the minimum voltage differential between the reference voltage and the source voltage.

22. The apparatus of claim 20,
wherein the output clamping module comprises a diode coupled between the first output node and ground.

23. The apparatus of claim 20,
wherein the output clamping module comprises an NMOS transistor with a source node coupled with ground and a gate node and a drain node each coupled with the first output node.

24. The apparatus of claim 21,
wherein the output clamping module comprises a PMOS transistor with a source node coupled to a reference supply voltage level and a gate node and a drain node each coupled to a corresponding one of the first and second output nodes.

25. The apparatus of claim 14, further comprising:
a current density compensation module, communicatively coupled with the first output node, and configured to limit effect of changes in current through the first delay buffer module on an amount of phase shifting provided by the first delay buffer.

26. The apparatus of claim 25,
wherein the current density compensation module comprises a capacitor communicatively coupled between the first output node and ground.

27. The apparatus of claim 14,
wherein the first delay buffer module is further configured to provide buffering between the first input signal and the first output signal.

28. The apparatus of claim 14,
wherein the first delay buffer module is further configured to contribute to clamping the reference voltage to ensure the minimum voltage differential between the reference voltage and the source voltage.

29. An apparatus comprising:
a first means for generating a first output signal at a first output node as a function of a first input signal such that the first output signal is phase-shifted with respect to the first input signal;

a second means for generating a second output signal at a second output node as a function of a second input signal such that the second output signal is phase-shifted with respect to the second input signal;

a third means for functionally relating the first output signal with the second output signal such that the second output signal is substantially the complement of the first output signal;

a fourth means for clamping the first output signal to generate a clamped first output signal and for clamping the second output signal to generate a clamped second output signal;

a fifth means for clamping a reference voltage at least partially as a function of the clamped first output signal and the clamped second output signal to maintain at least a minimum voltage differential between the reference voltage and a source voltage;

a current generating means for generating current coupled between the source voltage and the reference voltage, configured to source current to the first means, the second means, and the third means, and comprising at least a first current source and switch connected in series with the first current source, wherein the current generating means is responsive to a plurality of reference voltage levels; and a voltage generating means for providing the plurality of reference voltage levels to the current generating means based at least in part on first and second control signals provided to the voltage generating means.

30. The apparatus of claim 29, further comprising:
a sixth means for limiting an effect of changes in current through the first means on an amount of phase shifting provided by the first means.

* * * * *